(12) United States Patent
Do et al.

(10) Patent No.: US 7,829,984 B2
(45) Date of Patent: Nov. 9, 2010

(54) INTEGRATED CIRCUIT PACKAGE SYSTEM STACKABLE DEVICES

(75) Inventors: Byung Tai Do, Singapore (SG); Linda Pei Ee Chua, Singapore (SG); Heap Hoe Kuan, Singapore (SG)

(73) Assignee: Stats Chippac Ltd., Singapore (SG)

( * ) Notice: Subject to any disclaimer, the term of this patent is extended or adjusted under 35 U.S.C. 154(b) by 0 days.

(21) Appl. No.: 12/146,101

(22) Filed: Jun. 25, 2008

(65) Prior Publication Data

US 2009/0321899 A1  Dec. 31, 2009

(51) Int. Cl.
*H01L 23/495* (2006.01)

(52) U.S. Cl. ............... 257/666; 257/787; 257/E23.031; 257/E23.052; 257/E23.054; 438/111; 438/112; 438/123

(58) Field of Classification Search ......... 257/666–677, 257/E23.031–E23.059, 787–795; 438/111, 438/112, 123, FOR. 366, FOR. 367, FOR. 377, 438/FOR. 380
See application file for complete search history.

(56) References Cited

U.S. PATENT DOCUMENTS

| 5,250,843 | A | 10/1993 | Eichelberger | |
|---|---|---|---|---|
| 6,548,328 | B1 * | 4/2003 | Sakamoto et al. | 438/121 |
| 6,838,752 | B2 | 1/2005 | Diot | |
| 6,861,288 | B2 | 3/2005 | Shim et al. | |
| 6,940,154 | B2 * | 9/2005 | Pedron et al. | 257/666 |
| 7,253,511 | B2 | 8/2007 | Karnezos et al. | |
| 7,589,407 | B2 * | 9/2009 | Karnezos | 257/686 |
| 2004/0183166 | A1 * | 9/2004 | Abbott | 257/666 |
| 2008/0001276 | A1 | 1/2008 | Lee et al. | |
| 2008/0017972 | A1 | 1/2008 | Bauer et al. | |

* cited by examiner

*Primary Examiner*—Jasmine J Clark
(74) *Attorney, Agent, or Firm*—Mikio Ishimaru

(57) ABSTRACT

An integrated circuit package system includes: providing a finger lead having a side with an outward exposed area and an inward exposed area separated by a lead cavity; positioning a chip adjacent the finger lead and connected to the finger lead; and a stack encapsulant encapsulating the chip and the finger lead with the outward exposed area and the inward exposed area of the finger lead substantially exposed.

17 Claims, 7 Drawing Sheets

INTEGRATED CIRCUIT PACKAGE SYSTEM STACKABLE DEVICES

TECHNICAL FIELD

The present invention relates generally to integrated circuit packages and more particularly to package in package (PIP) integrated circuit package systems.

BACKGROUND ART

The integrated circuit package is the building block used in a high performance electronic system to provide applications for usage in products such as automotive vehicles, pocket personal computers, intelligent portable military devices, aeronautical spacecraft payloads, and a vast line of other similar products that require small compact electronics supporting many complex functions.

The integrated circuit package can consists of a package base or package substrate providing a mounting structure for attachment of at least one chip or die and an enclosure such as an epoxy applied on it to protect its contents. Typically, one side of the chip or die is used primarily for the mounting the chip or die.

The other side of the chip or die, referred to as an active surface of the chip or die, has electrically conductive areas that provide for electrical connections to its circuitry. Connectors, consisting of electrically conductive material, attach to the conductive areas to provide electrical connection between the circuitry of the chip or die and other circuitry not of the same chip or die.

The other circuitry can be from several possible sources. One possible source can be circuitry resident within the integrated circuit package, such as from another chip, indicative of a multiple chip integrated circuit package. Another possible source can be of circuitry residing outside the integrated circuit package such as from a printed circuit board within the electronic system.

Yet another possible source can be circuitry from one or more separate integrated circuit packages having one or more chips or dice within it. The separate integrated circuit packages can be connected with the conductors and enclosed together resulting in a single sealed package structure, or can be externally connected onto the single sealed package structure. Integrated circuit packages with small footprints and high internal IO connectivity are sought after for products with small printed circuit board systems. Global market demands also require solutions that provide lower costs and higher reliability through simplified manufacturing processing and early testing of circuitry for known good die (KGD) during fabrication which result in higher yield and improved circuitry reliability. Also, the leverage and flexibility provided by replacing package components as needed contribute to market leadership.

Attempts have failed to provide a complete solution addressing simplified manufacturing processing, smaller dimensions, lower costs due to design flexibility, reduced package counts, increased functionality, leveragability, and increased IO connectivity capabilities.

In view of the ever-increasing commercial competitive pressures, along with growing consumer expectations and the diminishing opportunities for meaningful product differentiation in the marketplace, it is critical that answers be found for these problems.

Solutions to these problems have been long sought but prior developments have not taught or suggested any solutions and, thus, solutions to these problems have long eluded those skilled in the art.

DISCLOSURE OF THE INVENTION

The present invention includes: providing a finger lead having a side with an outward exposed area and an inward exposed area separated by a lead cavity; positioning a chip adjacent the finger lead and connected to the finger lead; and a stack encapsulant encapsulating the chip and the finger lead with the outward exposed area and the inward exposed area of the finger lead substantially exposed.

Certain embodiments of the invention have other aspects in addition to or in place of those mentioned above. The aspects will become apparent to those skilled in the art from a reading of the following detailed description when taken with reference to the accompanying drawings.

BEST MODE FOR CARRYING OUT THE INVENTION

Figure 1:
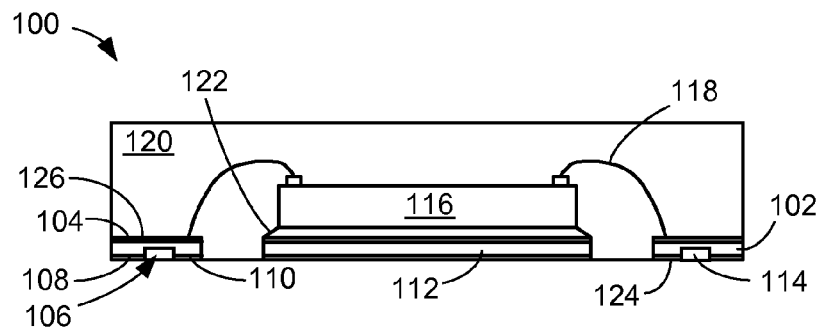
FIG. 1 is a cross-sectional view of an integrated circuit package system taken along line 1-1 of FIG. 2 in a first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail. Likewise, the drawings showing embodiments of the system are semi-diagrammatic and not to scale and, particularly, some of the dimensions are for the clarity of presentation and are shown greatly exaggerated in the drawing FIGs.

Where multiple embodiments are disclosed and described, having some features in common, for clarity and ease of illustration, description, and comprehension thereof, similar and like features one to another will ordinarily be described with like reference numerals. The embodiments may be numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the invention, regardless of its orientation. The term "vertical" refers to a direction perpendicular to the horizontal as just defined. Terms, such as "on", "above", "below", "bottom", "top", "side" (as in "sidewall"), "higher", "lower", "upper", "over", and "under", are defined with respect to the horizontal plane.

The term "on" as used herein means and refers to direct contact among elements. The term "processing" as used herein includes deposition of material, patterning, exposure, development, etching, cleaning, and/or removal of the material or trimming as required in forming a described structure. The term "system" as used herein means and refers to the method and to the apparatus of the present invention in accordance with the context in which the term is used.

Figure 2:
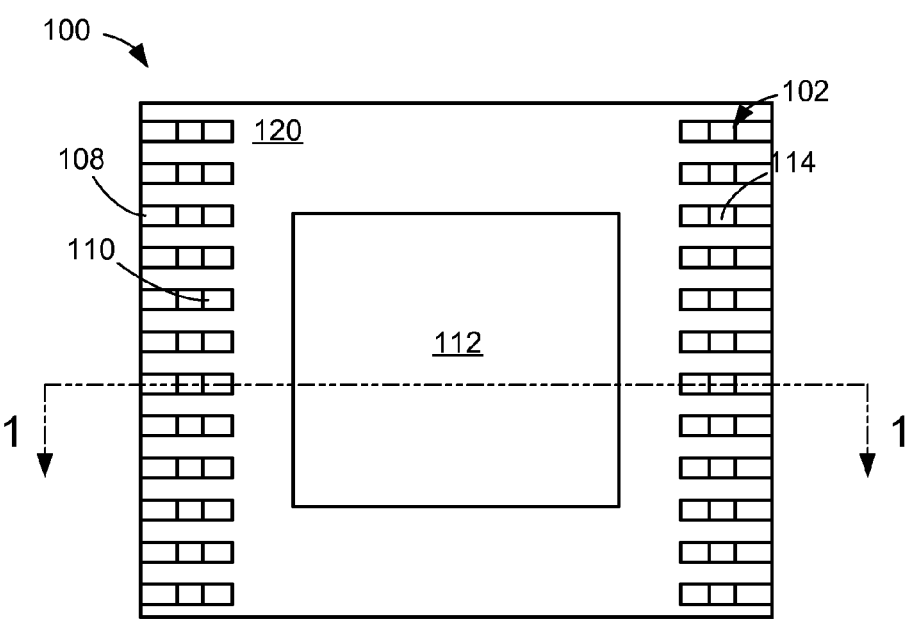
FIG. 2 is a bottom view of the integrated circuit package system in the first embodiment of the present invention.

Referring now to FIG. 1, therein is shown a cross-sectional view of an integrated circuit package system 100 taken along line 1-1 of FIG. 2 in a first embodiment of the present invention. The integrated circuit package system 100 can preferably include finger leads 102, an internal lead surface 104, a lead cavity 106, an outward exposed area 108, an inward exposed area 110, and a die paddle 112.

The integrated circuit package system 100 can also include a filler 114, a chip 116, connectors 118, and a stack encapsulant 120. The finger leads 102 and the die paddle 112 can consists of conductive materials such as copper, aluminum, or materials having similar properties. The finger leads 102 can be distributed along an edge of the integrated circuit package system 100 and along an opposite edge of the integrated circuit package system 100.

The die paddle 112 can be located between edges of the integrated circuit package system 100 having the finger leads 102. The chip 116 is mounted above the die paddle 112 using an attachment layer 122. Each of the finger leads 102 can be oriented with one end adjacent the side of the integrated circuit package system 100 and the opposite end adjacent the chip 116.

The internal lead surface 104 of each of the finger leads 102 can be used to provide connectivity between the finger leads 102 and circuitry of the chip 116 using the connectors 118 such as bond wires. The side opposite the internal lead surface 104 can include formations consisting of the lead cavity 106, the outward exposed area 108, and the inward exposed area 110. The outward exposed area 108 and the inward exposed area 110 can provide connectivity using methods such as with wire bonding or similar connection methods.

The lead cavity 106 separates the outward exposed area 108 from the inward exposed area 110. The lead cavity 106 can be formed by the partial removal of surface material across the dimensional width of a midsection of the finger leads 102. The section of the finger leads 102 having the lead cavity 106 is substantially thinner than any other section of the finger leads 102.

The outward exposed area 108 of each of the finger leads 102 is located adjacent the side of the edge of the integrated circuit package system 100. The inward exposed area 110 of each of the finger leads 102 is located adjacent the chip 116. The stack encapsulant 120, such as an epoxy, can be applied over the chip 116, the connectors 118, and the finger leads 102. The inward exposed area 110 or the outward exposed area 108 can be substantially exposed adjacent the stack encapsulant 120. The surface of the die paddle 112 facing away from the chip 116 can be substantially exposed adjacent the stack encapsulant 120.

The filler 114, consisting of an insulative support layer, the stack encapsulant 120, or any other material having similar properties, can be used to fill the lead cavity 106 to provide additional structural rigidity for any of the finger leads 102. The inward exposed area 110 can be used for temporary connectivity of testing apparatus such as probes, clips, and similar tester connectors.

The top, sides, or bottom surfaces of the integrated circuit package system 100 can optionally be further processed for desired fit or finish such as with a sanding, polishing, grinding, or similar process. The outward exposed area 108 of the resulting integrated circuit package system 100 can provide connectivity to a next level of packaging integration such as an internal stacking module package, package in package, or any combination component package.

The individual finger leads 102 or the die paddle 112 can optionally be formed to have other predetermined geometric shapes or sizes in accordance with user specific requirements. The outward exposed area 108, the inward exposed area 110, or the surface opposite the surface of the die paddle 112 having the attachment layer 122 could optionally have a first coating layer 124 such as gold, palladium, nickel, silver, tin, or similar alloy combinations, to improve connectivity characteristics.

The internal lead surface 104 or surface of the die paddle 112 having the attachment layer 122 could optionally have a second coating layer 126 such as gold, palladium, nickel, silver, tin, or similar alloy combinations, to improve connectivity characteristics. It is noted that the circuitry within the integrated circuit package system 100 could consists of multiple die stacks, multiple packages, flip chip, or any circuitry contained with a defined package.

It is also noted that the usage of the outward exposed area 108 or the inward exposed area 110 could be used to provide connectivity to a next level of packaging integration. The die paddle 112 could optionally be omitted having the chip 116 mounted above a plane formed the finger leads 102, resulting a reduced Z-height version of the integrated circuit package system 100.

It has been unexpectedly discovered that the inward exposed area 110 can be reserved for unit testing of the integrated circuit package system 100 and the outward exposed area 108 can be reserved for next level connectivity purposes resulting in substantial improvements in both shipped product quality and manufacturing product yields. Potential problems affecting next level connectivity attributed to testing such as probe marks, indentations, or similar residual conditions, can be eliminated with the integrated circuit package system 100.

Referring now to FIG. 2, therein is shown a bottom view of the integrated circuit package system 100 in the first embodiment of the present invention. Shown is the stack encapsulant 120 adjacent the edges of the finger leads 102 and the die paddle 112. The finger leads 102 along an edge of the integrated circuit package system 100 and along an opposite edge.

The outward exposed area 108 and the inward exposed area 110 of each of the finger leads 102 are shown separated by the filler 114. The die paddle 112, the outward exposed area 108, the inward exposed area 110, and the filler 114 are shown exposed adjacent the bottom surface of the stack encapsulant 120.

Figure 3:
FIG. 3 is the structure of FIG. 2 in an initial assembly phase.

Referring now to FIG. 3, therein is shown the structure of FIG. 2 in an initial assembly phase. A chip carrier 302, having a predefined length, width, and thickness, can be used to provide structural support of components and circuitry of the integrated circuit package system 100.

The chip carrier 302 can be composed of material such as copper, aluminum, alloy derivatives, polymer derivatives, or other material having similar properties. The chip carrier 302 can be a temporary structure having process provisions for removal during the manufacturing of the integrated circuit package system 100.

Figure 4:
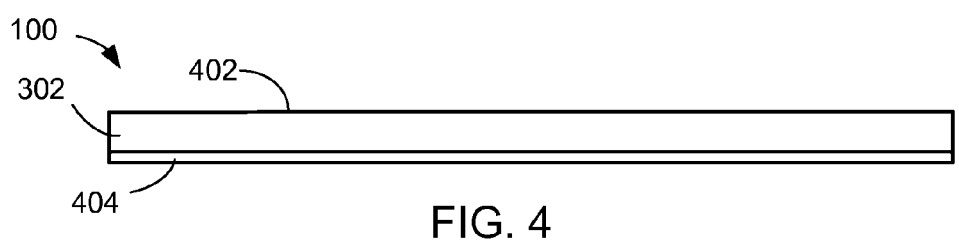
FIG. 4 is the structure of FIG. 3 in a first photoresist layering phase.

Referring now to FIG. 4, therein is shown is the structure of FIG. 3 in a first photoresist layering phase. A surface opposite a base surface 402 of the chip carrier 302 can be covered with a first photoresist layer 404. The first photoresist layer 404 can consist of a light sensitive material such as a polymer. The first photoresist layer 404 can be exposed to light resulting in the first photoresist layer 404 having resist properties which can protect the chip carrier 302 during manufacturing process steps such as etching.

Figure 5:
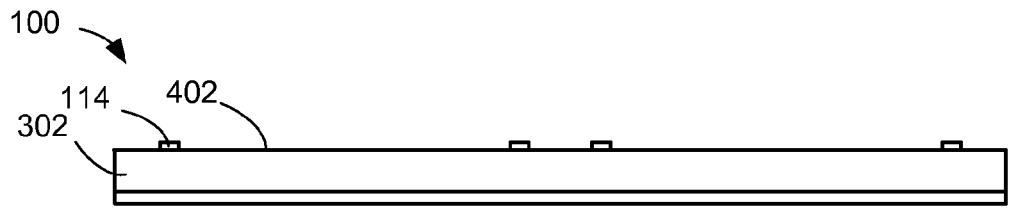
FIG. 5 is the structure of FIG. 4 in a filler phase.

Referring now to FIG. 5, therein is shown the structure of FIG. 4 in a filler phase. The filler 114 can be applied on the base surface 402 of the chip carrier 302. The filler 114 can be distributed along a row parallel to one edge of the chip carrier 302 and a row parallel an opposite edge. A row consisting of the filler 114 can also be mounted adjacent both sides of a line defined by the cross-sectional midpoints of the chip carrier 302.

Figure 6:
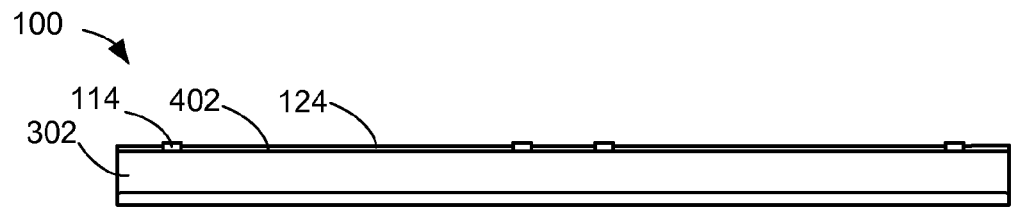
FIG. 6 is the structure of FIG. 5 in a first layering phase.

Referring now to FIG. 6, therein is shown the structure of FIG. 5 in a first layering phase. The first coating layer 124, such as gold, palladium, nickel, silver, tin, or similar alloy combination, can be applied on the base surface 402 of the chip carrier 302 and adjacent the filler 114. The first coating layer 124 can be applied using techniques such as plating, sputter deposition, physical vapor deposition, chemical vapor deposition, or similar technique.

The first coating layer 124 can have a predefined thickness specified by the user or manufacturer.

Figure 7:
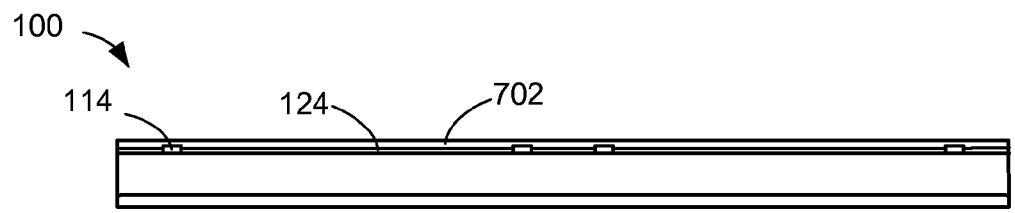
FIG. 7 is the structure of FIG. 6 in a conductive layering phase.

Referring now to FIG. 7, therein is shown the structure of FIG. 6 in a conductive layering phase. A conductive layer 702, such as copper, aluminum, or similar alloy combinations, can be applied on the first coating layer 124 and covering the filler 114. The conductive layer 702 can be applied using techniques such as plating, sputter deposition, physical vapor deposition, chemical vapor deposition, or similar technique.

The conductive layer 702 can have a thickness substantially greater than the thickness of the filler 114.

Figure 8:
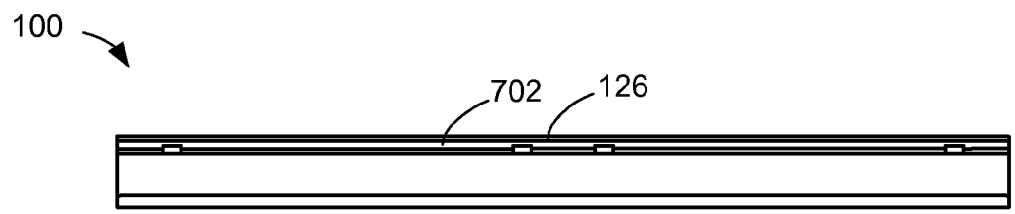
FIG. 8 is the structure of FIG. 7 in a second layering phase.

Referring now to FIG. 8, therein is shown the structure of FIG. 7 in a second layering phase. The second coating layer 126, such as gold, palladium, nickel, silver, tin, or similar alloy combinations, can be applied over the conductive layer 702. The second coating layer 126 can be applied using techniques such as plating, sputter deposition, physical vapor deposition, chemical vapor deposition, or similar technique.

The second coating layer 126 can have a predefined thickness specified by the user or manufacturer.

Figure 9:
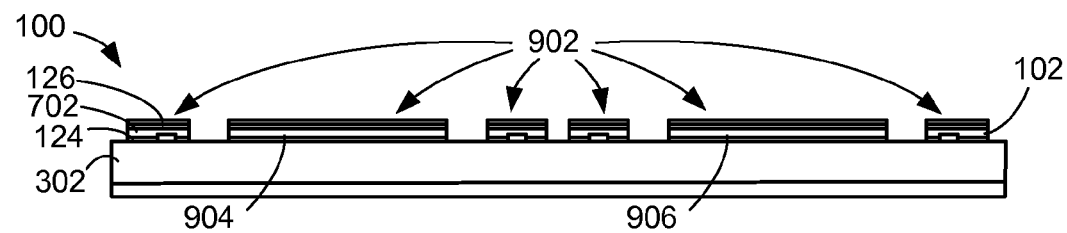
FIG. 9 is the structure of FIG. 8 in a lead formation phase.

Referring now to FIG. 9, therein is shown the structure of FIG. 8 in a lead formation phase. A second photoresist layer 902 consisting of a light sensitive material can be applied on the second coating layer 126. Areas of the second photoresist layer 902 can selectively be exposed to light resulting in those areas having resist properties with profile shapes of the finger leads 102, a first die paddle 904, and a second die paddle 906.

The finger leads 102 can be located adjacent one edge of the chip carrier 302 and an opposite edge. The finger leads 102 also can be located adjacent each side of a line located midway between the one edge of the chip carrier 302 and the opposite edge. The first die paddle 904 can be located between the finger leads 102 along the one edge of the chip carrier 302 and the finger leads 102 adjacent the line and furthest from the opposite edge.

The second die paddle 906 can be located between the finger leads 102 along the opposite edge of the chip carrier 302 and the finger leads 102 adjacent the line and furthest from the first die paddle 904. The physical quantities and geometries of the finger leads 102, the first die paddle 904, or the second die paddle 906 could optionally be modified to generate other configurations of the integrated circuit package system 100.

The areas of the second photoresist layer 902 that have not been exposed to light and do not have resist properties can be removed. The layers of material below any removed areas of the second photoresist layer 902 such as the second coating layer 126, the conductive layer 702, and the first coating layer 124, can also be removed using a process such as etching.

Figure 10:
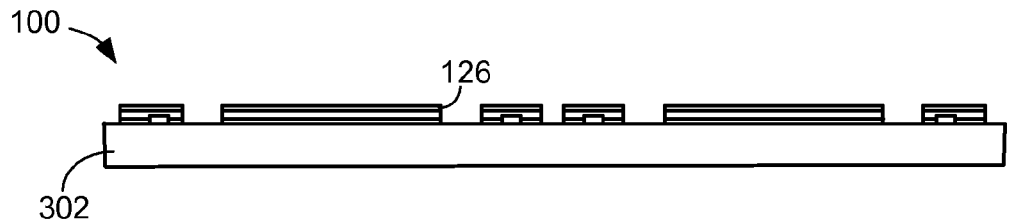
FIG. 10 is the structure of FIG. 9 in a photoresist removal phase.

Referring now to FIG. 10, therein is shown the structure of FIG. 9 in a photoresist removal phase. The first photoresist layer 404 of FIG. 4 having resist properties can be removed from the chip carrier 302 using a strip process such as wet solution stripping, dry plasma stripping, or similar equivalent stripping process.

The second photoresist layer 902 of FIG. 9 having resist properties can be removed from the second coating layer 126 using a stripping process such as wet solution stripping, dry plasma stripping, or similar equivalent stripping process.

Figure 11:
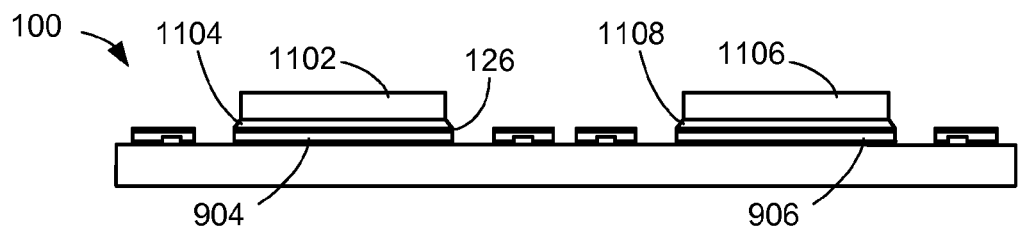
FIG. 11 is the structure of FIG. 10 in a die attachment phase.

Referring now to FIG. 11, therein is shown the structure of FIG. 10 in a die attachment phase. A first chip 1102 can be mounted on the second coating layer 126 of the first die paddle 904 using the first attachment layer 1104. A second chip 1106 can be mounted on the second coating layer 126 of the second die paddle 906 using the second attachment layer 1108.

It is noted that the first chip 1102 or the second chip 1106 could optionally be a replicate of the chip 116 of the integrated circuit package system 100 of FIG. 1.

Figure 12:
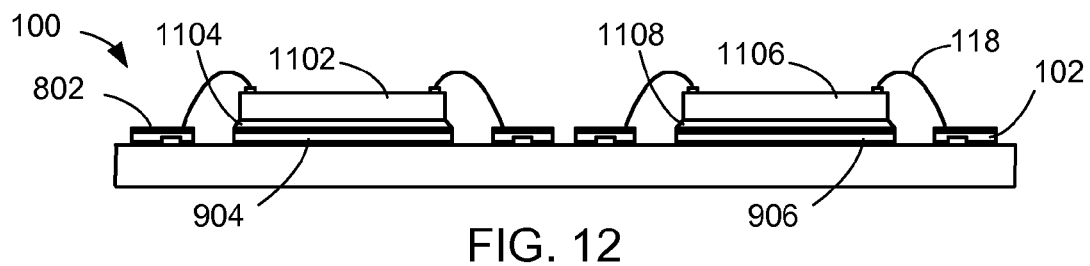
FIG. 12 is the structure of FIG. 11 in a connection phase.

Referring now to FIG. 12, therein is shown the structure of FIG. 11 in a connection phase. The connectors 118 can provide connectivity between circuitry of the first chip 1102 and the second coating layer 126 of the finger leads 102 adjacent opposite edges of the first die paddle 904. The connectors 118 can provide connectivity between circuitry of the second chip 1106 and the second coating layer 126 of the finger leads 102 adjacent opposite edges of the second die paddle 906.

Figure 13:
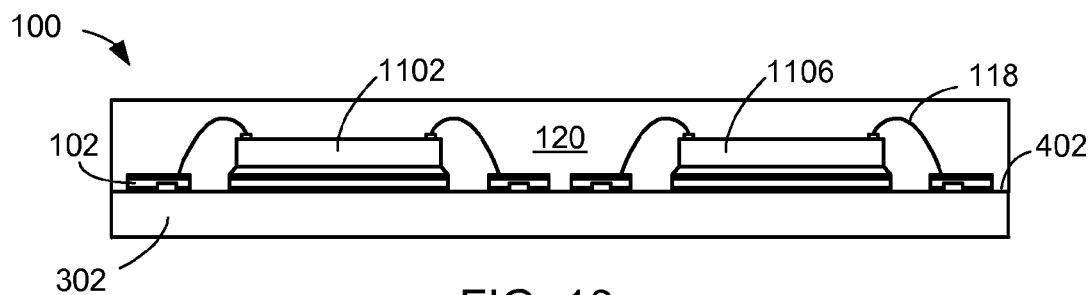
FIG. 13 is the structure of FIG. 12 in an encapsulation phase.

Referring now to FIG. 13, therein is shown the structure of FIG. 12 in an encapsulation phase. The stack encapsulant 120 can be applied over the first chip 1102, the second chip 1106, the connectors 118, the finger leads 102, and the base surface 402 of the chip carrier 302. The surface opposite the base surface 402 of the chip carrier 302 can be exposed and substantially free of the stack encapsulant 120.

Figure 14:
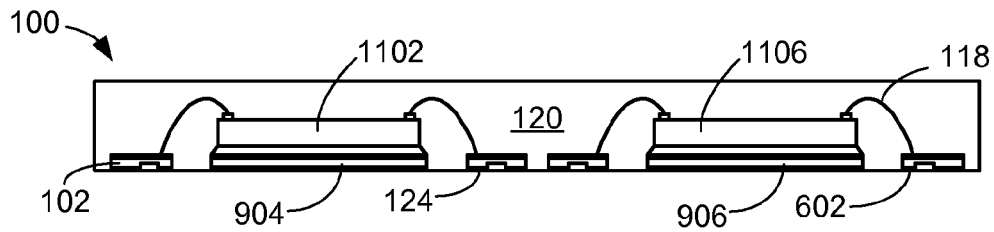
FIG. 14 is the structure of FIG. 13 in a carrier removal phase.

Referring now to FIG. 14, therein is shown the structure of FIG. 13 in a carrier removal phase. The chip carrier 302 of FIG. 13 can be removed from the stack encapsulant 120 and the first coating layer 124 using a removal process such as back etching, substantially exposing the first coating layer 124 and the stack encapsulant 120 of the integrated circuit package system 100.

Figure 15:
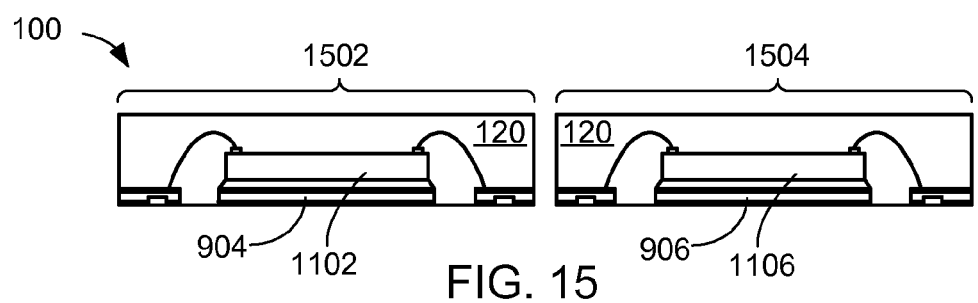
FIG. 15 is the structure of FIG. 14 in a singulation phase.

Referring now to FIG. 15, therein is shown the structure of FIG. 14 in a singulation phase. A separation process, such as sawing, can be made along a plane formed perpendicular to the encapsulant 120 of FIG. 14 and located on a line defined by locations located midway between one edge and the edge opposite of the integrated circuit package system 100.

The separation process can result in formation of a first package assembly 1502 and a second package assembly 1504 from the integrated circuit package system 100. The surfaces of the first package assembly 1502 or the second package assembly 1504 can optionally be further processed, such as by grinding, sanding, polishing, or similar processes.

The first package assembly 1502 or the second package assembly 1504 could be replications of the integrated circuit package system 100 provided the first chip 1102 or the second chip 1106 is a replication of the chip 116 of FIG. 1. The circuitry of the first chip 1102 can optionally have different circuitry from the second chip 1106 resulting in two functionally different package assemblies.

It is noted that the first die paddle 904 or the second die paddle 906 could optionally have been omitted resulting a reduced Z-height version of the first package assembly 1502 or the second package assembly 1504.

Figure 16:
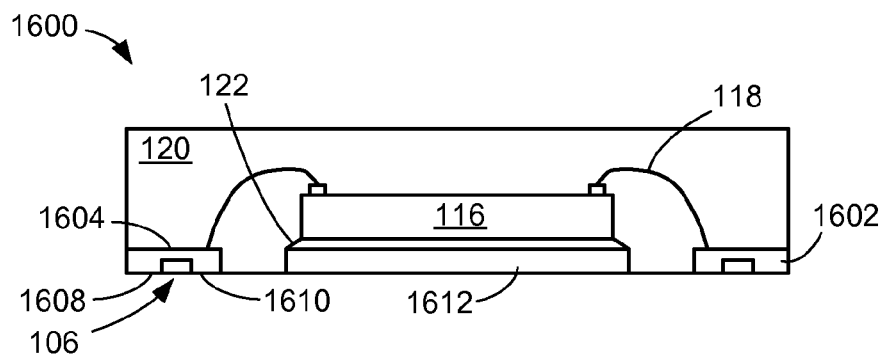
FIG. 16 is a cross-sectional view similar to FIG. 1 of an integrated circuit package system in a second embodiment of the present invention.

Referring now to FIG. 16, therein is shown a cross-sectional view similar to FIG. 1 of an integrated circuit package system 1600 in a second embodiment of the present invention.

The integrated circuit package system 1600 can preferably include finger leads 1602, an internal lead surface 1604, the lead cavity 106, an outward exposed area 1608, the inward exposed area 1610, and a die paddle 1612. The integrated circuit package system 1600 can also include the chip 116, the connectors 118, and the stack encapsulant 120.

The finger leads 1602 and the die paddle 1612 can consists of conductive materials such as copper or Alloy42 with a pre-plated treatment. The finger leads 1602 can be distributed along an edge of the integrated circuit package system 1600 and along an opposite edge of the integrated circuit package system 1600. The die paddle 1612 can be located between edges of the integrated circuit package system 1600 having the finger leads 1602.

The chip 116 is mounted over the die paddle 1612 using the attachment layer 122. Each of the finger leads 1602 can be oriented with one end adjacent the edge of the integrated circuit package system 1600 and the opposite end adjacent the chip 116. The internal lead surface 1604 of each of the finger leads 1602 can be used to provide connectivity between the finger leads 1602 and circuitry of the chip 116 using the connectors 118 such as bond wires.

The side opposite the internal lead surface 1604 can include formations consisting of the lead cavity 106, the outward exposed area 1608, and the inward exposed area 1610. The outward exposed area 1608 and the inward exposed area 1610 can provide connectivity using methods such as with wire bonding or similar connection methods. The lead cavity 106 separates the outward exposed area 1608 from the inward exposed area 1610.

The lead cavity 106 can be formed by the partial removal of surface material across the dimensional width of a midsection of the finger leads 1602. The section of the finger leads 1602 having the lead cavity 106 is substantially thinner than any other section of the finger leads 1602. The outward exposed area 1608 of each of the finger leads 1602 is located adjacent the side of the edge of the integrated circuit package system 1600.

The inward exposed area 1610 of each of the finger leads 1602 is located adjacent the chip 116. The stack encapsulant 120, such as an epoxy, can be applied over the chip 116, the connectors 118, and the finger leads 1602. The inward exposed area 1610 or the outward exposed area 1608 can be substantially exposed adjacent the stack encapsulant 120. The surface of the die paddle 1612 facing away from the chip 116 can be substantially exposed adjacent the stack encapsulant 120.

The stack encapsulant 120 can be used to fill the lead cavity 106 to provide additional structural rigidity to any of the finger leads 1602. The inward exposed area 1610 can be used for temporary connectivity of testing apparatus such as probes, clips, and similar tester connectors. The outward exposed area 1608 of the resulting integrated circuit package system 1600 can provide connectivity to a next level of packaging integration such as an internal stacking module package, package in package, or any combination component package.

The individual finger leads 1602 or the optional die pad 1612 can optionally be formed to have other predetermined geometric shapes or sizes in accordance with user specific requirements. It is noted that the circuitry within the integrated circuit package system 1600 is non-restrictive in content and could consists of multiple die stacks, multiple packages, flip chip, or any circuitry contained with a defined package.

It is also noted that the usage of the outward exposed area 1608 or the inward exposed area 1610 could be used to provide connectivity to a next level of packaging integration.

Figure 17:
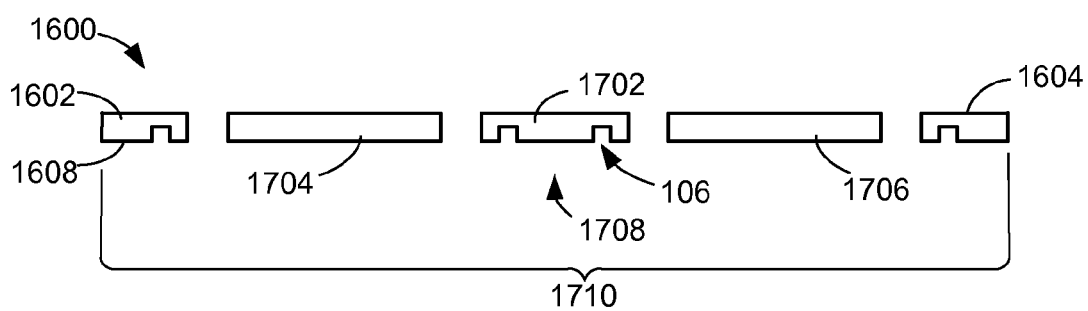
FIG. 17 is the structure of FIG. 16 in an initial assembly phase.

Referring now to FIG. 17, therein is shown the structure of FIG. 16 in an initial assembly phase. The integrated circuit package system 1600 can preferably include a structure 1710 of conductive material such as copper or pre-plated alloy42, consisting of the finger leads 1602, center leads 1702, a first die paddle 1704, a second die paddle 1706, and a base surface 1708.

The finger leads 1602, the center leads 1702, the first die paddle 1704, and the second die paddle 1706 of the structure 1710 can be positioned within a single horizontal plane during assembly. The finger leads 1602 can be distributed adjacent a side edge of the structure 1710 and adjacent the side edge opposite of the structure 1710.

The center leads 1702 can be distributed centrally between the finger leads 1602 adjacent two opposing side edges of the structure 1710. Each of the center leads 1702 can have a formation equivalent to two of the finger leads 1602 joined at one end.

The first die paddle 1704 above a die mounting region can be located between the finger leads 1602 adjacent one side edge of the structure 1710 and the center leads 1702. The second die paddle 1706 above another die mounting region can be located between the finger leads 1602 along the side opposite of the structure 1710 furthest from the first die paddle 1704 and the center leads 1702.

Figure 18:
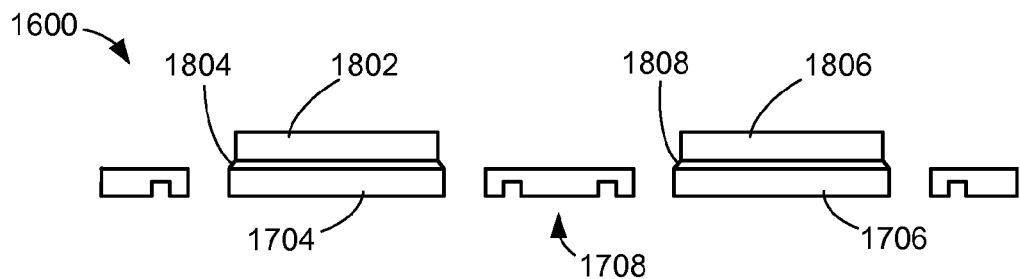
FIG. 18 is the structure of FIG. 17 in a die attachment phase.

Referring now to FIG. 18, therein is shown the structure of FIG. 17 in a die attachment phase. A first chip 1802 can be mounted over the side opposite the base surface 1708 of the first die paddle 1704 using a first attachment layer 1804. A second chip 1806 can be mounted over the side opposite the base surface 1708 of the second die paddle 1706 using a second attachment layer 1808.

Figure 19:
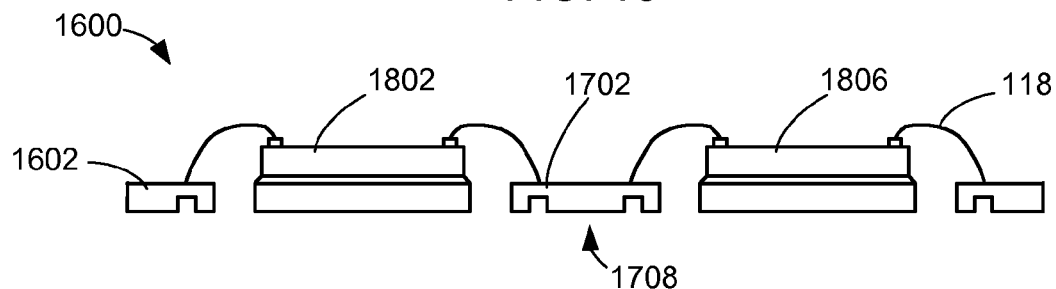
FIG. 19 is the structure of FIG. 18 in a connection phase.

Referring now to FIG. 19, therein is shown the structure of FIG. 18 in a connection phase. The connectors 118, such as bond wires, can provide connectivity between circuitry of the first chip 1802 and the side opposite the base surface 1708 of the adjacent finger leads 1602 or the center leads 1702. The connectors 118 can also provide connectivity between circuitry of the second chip 1806 and the side opposite the base surface 1708 of the adjacent finger leads 1602 or the center leads 1702.

It is noted that the first chip 1802 or the second chip 1806 could optionally be a replicate of the chip 116 of FIG. 1.

Figure 20:
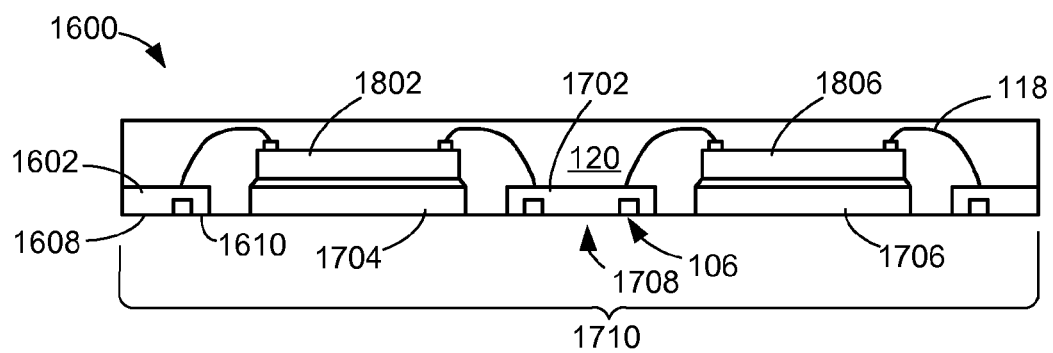
FIG. 20 is the structure of FIG. 19 in an encapsulation phase.

Referring now to FIG. 20, therein is shown the structure of FIG. 19 in an encapsulation phase. A stack encapsulant 120 such as an epoxy, can be applied over the structure 1710 including the first chip 1802, the second chip 1806, the connectors 118, and the finger leads 1602. The base surface 1708 of the inward exposed area 1610, the outward exposed area 1608, and the center leads 1702 are substantially exposed adjacent the stack encapsulant 120. The stack encapsulant 120 can be used to fill the lead cavity 106 of any the center leads 1702 or any of the finger leads 1602 to provide additional structural rigidity.

Note that physical quantities and geometries of the finger leads 1602, the center leads 1702, the first die paddle 1704, or the second die paddle 1706 of the structure 1710 could optionally be modified to generate other configurations of the integrated circuit package system 1600.

Figure 21:
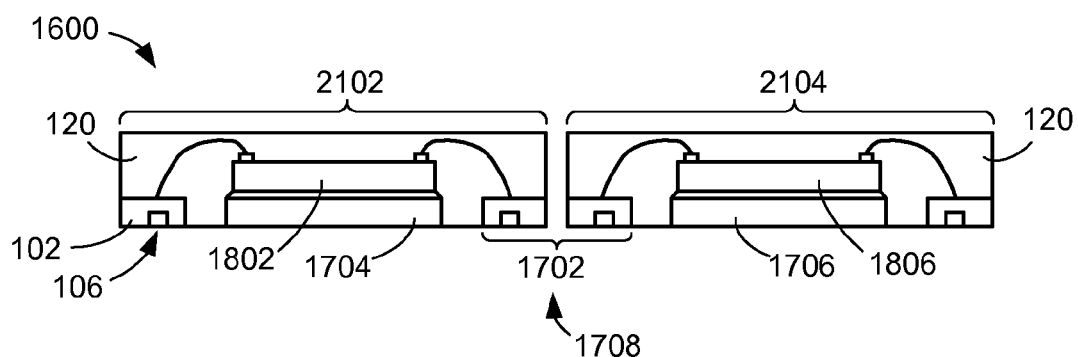
FIG. 21 is the structure of FIG. 20 in a singulation phase.

Referring now to FIG. 21, therein is shown the structure of FIG. 20 in a singulation phase. The center leads 1702 of FIG. 20 can be separated along a vertical plane having a central point on the base surface 1708 of each of the center leads 1702, extending through the stack encapsulant 120 directly above, and perpendicular to the base surface 1708. A first package assembly 2102 and a second package assembly 2104 can be formed from the integrated circuit package system 1600.

The first package assembly 2102 or the second package assembly 2104 could be replications of the integrated circuit package system 1600 provided the first chip 1802 or the second chip 1806 is a replicate of the chip 116 of FIG. 16. The circuitry of the first chip 2102 can optionally have different circuitry from the second chip 2104 resulting in two functionally different package assemblies.

It is noted that the first die paddle 1704 or the second die paddle 1706 could optionally have been omitted resulting a reduced Z-height version of the first package assembly 2102 or the second package assembly 2104.

Figure 22:
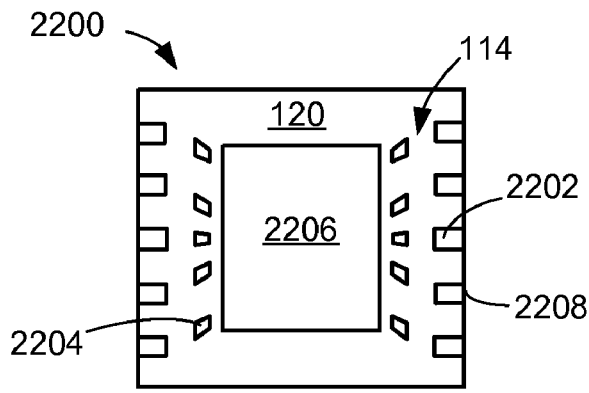
FIG. 22 is a bottom view similar to FIG. 2 of an integrated circuit package system in a third embodiment of the present invention.

Referring now to FIG. 22, therein is shown is a bottom view similar to FIG. 2 of an integrated circuit package system 2200 in a third embodiment of the present invention. The stack encapsulant 120 is shown adjacent an outward exposed area 2202, an inward exposed area 2204, and a die paddle 2206.

The outward exposed area 2202 and the inward exposed area 2204 corresponding to finger leads 2208 are shown separated by the filler 114.

The outward exposed area 2202 of each of the finger leads 2208 can be distributed adjacent one side edge of the integrated circuit package system 2200 and adjacent the side opposite of the integrated circuit package system 2200. The inward exposed area 2204 of each of the finger leads 2208 can be adjacent a side of the die paddle 2206. The die paddle 2206 can have a dimensional length and dimensional width forming a rectangular shape.

The dimensional width of the outward exposed area 2202 can be greater than the dimensional width of the inward exposed area 2204 of each of the finger leads 2208. The finger leads 2206 nearest a corner on a side of the integrated circuit package system 2200 can be tapered inwards toward the nearest adjacent corner along a parallel side of the die paddle 2206.

The individual finger leads 2208 or the die paddle 2206 can be optionally formed to have other predetermined geometric shapes or sizes in accordance with user specific requirements. It is noted that the die paddle 2206 can be optionally omitted and could result in only the outward exposed area 2202, the inward exposed area 2204, and the filler 114 visible adjacent the stack encapsulant 120.

Figure 23:
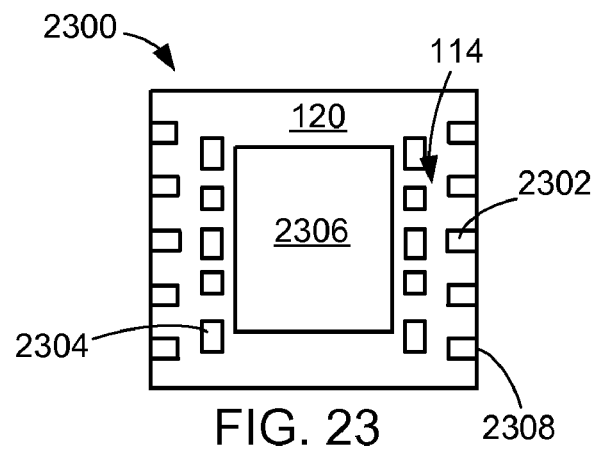
FIG. 23 is a bottom view similar to FIG. 2 of an integrated circuit package system in a fourth embodiment of the present invention.

Referring now to FIG. 23, therein is shown is a bottom view similar to FIG. 2 of an integrated circuit package system 2300 in a fourth embodiment of the present invention. The stack encapsulant 120 is shown adjacent an outward exposed area 2302, an inward exposed area 2304, and a die paddle 2306. The outward exposed area 2302 and the inward exposed area 2304 corresponding to finger leads 2308 are shown separated by the filler 114.

The outward exposed area 2302 of each of the finger leads 2308 can be distributed along a side of the integrated circuit package system 2300 and along a side opposite of the integrated circuit package system 2300. The inward exposed area 2304 of each of the finger leads 2308 can be adjacent a side of the die paddle 2306. The inward exposed area 2304 of each of the finger leads 2308 can be rectangular in shape and located adjacent a side of the die paddle 2306.

The dimensional length of inward exposed area 2304 can be perpendicular to the dimensional width of the outward exposed area 2302 of the finger leads 2308 and can be substantially greater in dimensional length than the dimensional width of the finger leads 2308. The dimensional width of the inward exposed area 2304 can have the same dimensional width of the outward exposed area 2302 of the finger leads 2308.

The finger leads 2308 nearest a corner on a side of the integrated circuit package system 2300 can be formed inwards toward the nearest adjacent corner along a parallel side of the die paddle 2306. The individual finger leads 2308 or the optional die pad 2306 can be optionally formed to have other predetermined geometric shapes or sizes in accordance with user specific requirements.

It is noted that the die paddle 2306 can be optionally omitted and could result in only the outward exposed area 2302, the inward exposed area 2304, and the filler 114 visible adjacent the stack encapsulant 120.

Figure 24:
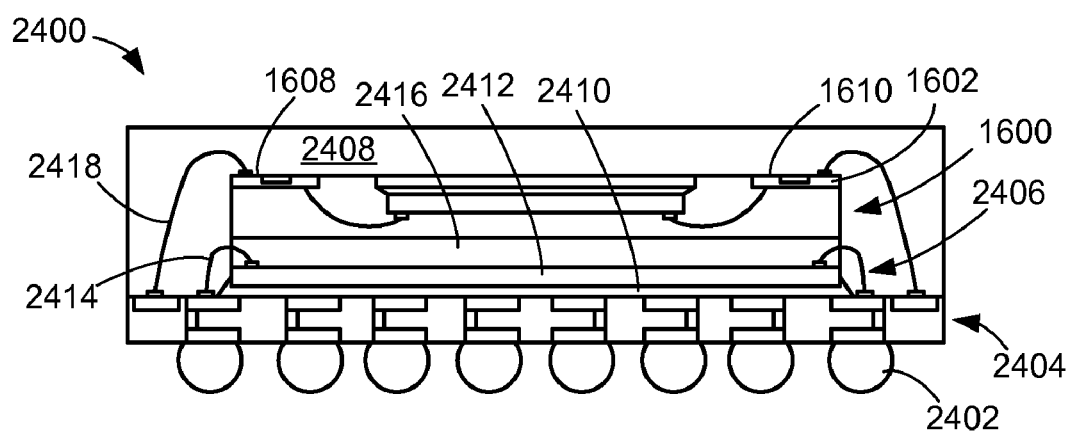
FIG. 24 a cross-sectional view similar to FIG. 1 of an integrated circuit package system in a fifth embodiment of the present invention.

Referring now to FIG. 24, therein is shown a cross-sectional view similar to FIG. 1 of an integrated circuit package system 2400 in a fifth embodiment of the present invention. The integrated circuit package system 2400 can preferably include system connectors 2402, a base package substrate 2404, a base module 2406, the integrated circuit package system 1600, and a package encapsulant 2408.

The system connectors 2402, such as solder balls, can attach on a side of the base package substrate 2404 to provide connectivity between the base package substrate 2404 and a next level of system integration such as a printed circuit board. The base package substrate 2404 can provide connectivity between the side with the system connectors 2402 and the side opposite.

Either side of the base package substrate 2404 can provide connectivity between any surface location and any another surface location of the same side. The base module 2406 can be mounted on a side opposite the side having the solder balls 2402 using an attachment layer 2410. The base module 2406 can consists of a die 2412 having circuit connectivity with the side opposite the side having the system connectors 2402 using internal connectors 2414 such as bond wires.

A module encapsulant 2416 such as an epoxy, can be applied over the die 2412 to protect the die 2412 and over some or all portions of the internal connectors 2414. The integrated circuit package system 1600 can be mounted above the package 2406 with the outward exposed area 1608 facing away from the base package substrate 2404. Stack connectors 2418, such as bond wires, can connect the outward exposed area 1608 of finger leads 1602 to the base package substrate 2404 providing connectivity between circuitry of the integrated circuit package system 1600 and the base package substrate 2404, the base module 2406, or the system connectors 2402.

The integrated circuit package system 2400 can optionally be tested using the inward exposed area 1610 for temporary test equipment connectivity. The package encapsulant 2408, such as an epoxy, can be applied over the integrated circuit package system 1600, the stack connectors 2418, any exposed portions of the internal connectors 2414, and the base package substrate 2404.

The surface of the base package substrate 2404 having the system connectors 2402 can be substantially exposed and free of the encapsulant 2408. It is noted that the contents of the base module 2406 is not restrictive and could for example consist of multiple dice, multiple packages, multiple components, or any combination thereof.

Figure 25:
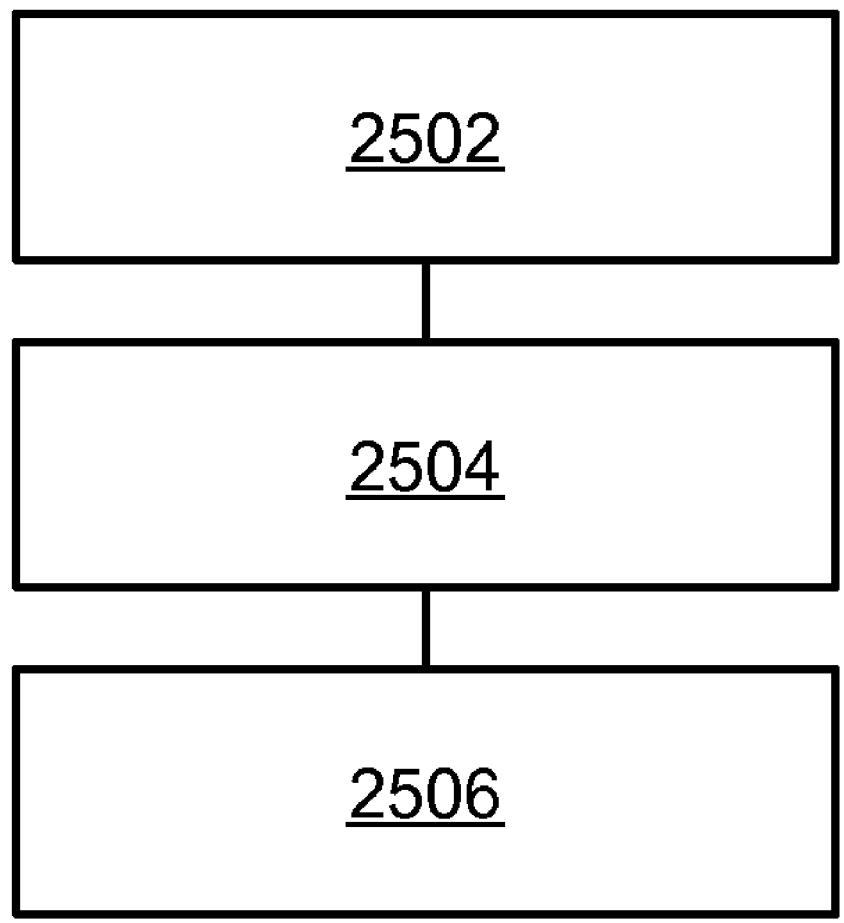
FIG. 25 therein is shown a flow chart of an integrated circuit package system for manufacturing the integrated circuit package system in an embodiment of the present invention.

Referring now to FIG. 25, therein is shown a flow chart of an integrated circuit package system 2500 for manufacturing the integrated circuit package system 100 in an embodiment of the present invention. The system 2500 includes providing a finger lead having a side with an outward exposed area and an inward exposed area separated by a lead cavity in a block 2502; positioning a chip adjacent the finger lead and connected to the finger lead in a block 2504; and a stack encapsulant encapsulating the chip and the finger lead with the outward exposed area and the inward exposed area of the finger lead substantially exposed in a block 2506.

In greater detail, a system to provide the method and apparatus of the integrated circuit package system 100, in an embodiment of the present invention, is performed as follows:

1. Providing a finger lead having a side with an outward exposed area and an inward exposed area separated by a lead cavity and having an internal lead surface on the side opposite the lead cavity.

2. Positioning a chip adjacent the finger lead and connected with connectors to the internal lead surface of the finger lead.

3. Applying a stack encapsulant over the chip, the connectors, and the finger lead with the outward exposed area and the inward exposed area substantially exposed.

Thus, it has been discovered that the integrated circuit package system method and apparatus of the present invention furnish important and heretofore unknown and unavailable solutions, capabilities, and functional aspects.

The resulting processes and configurations are straightforward, cost-effective, uncomplicated, highly versatile, accurate, sensitive, and effective, and can be implemented by adapting known components for ready, efficient, and economical manufacturing, application, and utilization.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations, which fall within the scope of the included claims. All matters hithertofore set forth herein or shown in the accompanying drawings are to be interpreted in an illustrative and non-limiting sense.

What is claimed is:

1. A method for manufacturing an integrated circuit package system comprising:
   providing a filler;
   forming a finger lead covering the filler and having a side with an outward exposed area and an inward exposed area separated by a lead cavity formed by the filler and having an internal lead surface on the side opposite the lead cavity;
   forming a second coating layer on a side opposite the outward exposed area and the inward exposed area;
   positioning a chip adjacent the finger lead and connected with connectors to the internal lead surface of the finger lead; and
   applying a stack encapsulant over the chip, the connectors, and the finger lead with the outward exposed area and the inward exposed area substantially exposed.

2. The method as claimed in claim 1 further comprising connecting a base module having a die with the outward exposed area of the finger lead.

3. The method as claimed in claim 1 further comprising forming a conductive layer over the lead cavity wherein the filler is substantially exposed adjacent the stack encapsulant.

4. The method as claimed in claim 1 wherein providing the finger lead includes forming a plurality of the finger leads with each having a different structural shape, adjacent a side of the chip with the inward exposed area closer together than the outward exposed area.

5. An integrated circuit package system comprising:
   a filler;
   a finger lead covering the filler and having a side with an outward exposed area and an inward exposed area separated by a lead cavity formed by the filler;
   a conductive layer over the lead cavity;
   a chip positioned adjacent the finger lead and connected to the finger lead; and
   a stack encapsulant applied over the chip and the finger lead with the outward exposed area and the inward exposed area of the finger lead substantially exposed.

6. The system as claimed in claim 5 further comprising a base module connected with the outward exposed area of the finger lead.

7. The system as claimed in claim 5 further comprising a first coating layer formed on the outward exposed area and the inward exposed area.

8. The system as claimed in claim 5 wherein a plurality of the finger leads formed adjacent a side of the chip with the inward exposed area closer together than the outward exposed area.

9. The system as claimed in claim 5 wherein:
the finger lead having a side with the outward exposed area and the inwards exposed area separated by the lead cavity and having an internal lead surface on the side opposite the lead cavity;
the chip adjacent the finger lead and connected with connectors to the internal lead surface of the finder lead; and
the stack encapsulant applied over the chip, the connectors, and the finger lead with the outward exposed area and the inward exposed area substantially exposed.

10. The system as claimed in claim 9 further comprising a base module having a die connected with the outward exposed area of the finger lead.

11. The system as claimed in claim 9 further comprising a conductive layer over the lead cavity adjacent the stack encapsulant.

12. The system as claimed in claim 9 wherein a plurality of the finger leads is each formed having a different structural shape, adjacent a side of the chip with the inward exposed area closer together than the outward exposed area.

13. The system as claimed in claim 9 further comprising a second coating layer formed on a side opposite the outward exposed area and the inward exposed area.

14. A method of manufacturing an integrated circuit package system comprising:
providing a filler;
forming a finger lead covering the filler and having a side with an outward exposed area and an inward exposed area separated by a lead cavity formed by the filler;
forming a conductive layer over the lead cavity;
positioning a chip adjacent the finder lead and connected to the finger lead; and
a stack encapsulant encapsulating the chip and the finder lead with the outward exposed area and the inward exposed area of the finger lead substantially exposed.

15. The method as claimed in claim 14 further comprising connecting a base module with the outward exposed area of the finger lead.

16. The method as claimed in claim 14 further comprising forming a first coating layer on the outward exposed area and the inward exposed area.

17. The method as claimed in claim 14 wherein providing the finer lead includes forming a plurality of the finder leads adjacent a side of the chip with the inward exposed area closer together than the outward exposed area.

* * * * *

UNITED STATES PATENT AND TRADEMARK OFFICE
CERTIFICATE OF CORRECTION

PATENT NO.        : 7,829,984 B2                                            Page 1 of 1
APPLICATION NO.   : 12/146101
DATED             : November 9, 2010
INVENTOR(S)       : Do et al.

It is certified that error appears in the above-identified patent and that said Letters Patent is hereby corrected as shown below:

<u>Column 13</u>

Claim 9, line 7, delete "finder" and insert therefor --finger--

<u>Column 14</u>

Claim 14, line 10, delete "finder" and insert therefor --finger--

Claim 17, line 20, delete "finer" and insert therefor --finger--

Claim 17, line 20, delete "finder" and insert therefor --finger--

Signed and Sealed this

Twenty-second Day of February, 2011

David J. Kappos
*Director of the United States Patent and Trademark Office*